United States Patent
Choi et al.

(10) Patent No.: US 11,083,116 B2
(45) Date of Patent: Aug. 3, 2021

(54) COOLER FOR DISPLAY, AND DISPLAY DEVICE HAVING SAME

(71) Applicant: LG ELECTRONICS INC., Seoul (KR)

(72) Inventors: Ji Won Choi, Seoul (KR); Se Hyeon Kim, Seoul (KR); Ju Hyok Kim, Seoul (KR); Han Choon Lee, Seoul (KR); Sung Wook Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 322 days.

(21) Appl. No.: 16/303,140

(22) PCT Filed: Dec. 16, 2016

(86) PCT No.: PCT/KR2016/014845
§ 371 (c)(1),
(2) Date: Nov. 19, 2018

(87) PCT Pub. No.: WO2017/200171
PCT Pub. Date: Nov. 23, 2017

(65) Prior Publication Data
US 2020/0337185 A1  Oct. 22, 2020

(30) Foreign Application Priority Data
May 20, 2016  (KR) .................... 10-2016-0062305

(51) Int. Cl.
*G06F 1/16* (2006.01)
*H05K 5/00* (2006.01)
(Continued)

(52) U.S. Cl.
CPC ....... *H05K 7/20972* (2013.01); *H05K 7/2099* (2013.01); *H05K 7/20172* (2013.01);
(Continued)

(58) Field of Classification Search
CPC .......... H05K 7/20972; H05K 7/20172; H05K 7/20336; H05K 7/2099
See application file for complete search history.

(56) References Cited

U.S. PATENT DOCUMENTS 7,995,342 B2 * 8/2011 Nakamichi ....... G02F 1/133308
361/696
9,470,924 B2 * 10/2016 Dunn ................. H05K 7/20972
(Continued)

FOREIGN PATENT DOCUMENTS

JP    4766499 B2    9/2011
JP    5202220 B2    6/2013
(Continued)

*Primary Examiner* — Anthony M Haughton
(74) *Attorney, Agent, or Firm* — Dentons US LLP (57) ABSTRACT

The present disclosure relates to a cooler and to a display device having the same, where a heat-exchanger of the cooler is arranged on a side surface of a display unit in order to simplify the structure and to make a slimmer display device. The cooler includes a closed air circulation pathway circulating between the front, rear and sides of the display unit; an open air flow pathway that flows in the length direction of the side of the display unit; and a cooling module that is installed on the side of the display along the length direction of the display, and that includes the heat-exchanger, where the closed air circulation path and the open air flow part are adjacent, thereby causing heat-exchange.

12 Claims, 4 Drawing Sheets

(51) Int. Cl.
  *H05K 7/00* (2006.01)
  *H05K 7/20* (2006.01)
  *G02F 1/1333* (2006.01)
  *H01L 51/52* (2006.01)

(52) U.S. Cl.
  CPC ... *H05K 7/20336* (2013.01); *G02F 1/133385* (2013.01); *H01L 51/529* (2013.01)

(56) References Cited

U.S. PATENT DOCUMENTS

| | | | | |
|---|---|---|---|---|
| 2011/0058326 A1* | 3/2011 | Idems | ................ | G09F 9/30 361/679.21 |
| 2011/0085301 A1* | 4/2011 | Dunn | ................ | H05K 7/20972 361/695 |
| 2015/0009627 A1* | 1/2015 | Dunn | ................ | H05K 7/20972 361/697 |

FOREIGN PATENT DOCUMENTS

| | | |
|---|---|---|
| KR | 2008-0010091 A | 1/2008 |
| KR | 1020110099134 A | 9/2011 |
| KR | 2012-0072880 A | 7/2012 |
| KR | 2013-0139244 A | 12/2013 |
| KR | 2014-0099137 A | 8/2014 |

\* cited by examiner

COOLER FOR DISPLAY, AND DISPLAY DEVICE HAVING SAME

The present application claims priority to Korean Patent Application No. 10-2016-0062305, filed on May 20, 2016, the entire contents of which is incorporated herein for all purposes by this reference, under Articles 119(35) and 365(35) of U.S. Patent Law.

BACKGROUND

Field of the Disclosure

The present disclosure relates to a cooler used for a display device, and more particularly to a cooler in which a heat exchanger is arranged on a side of a display unit so as to simplify a structure thereof and make a slimmer display device, and a display device having the cooler.

Background

A liquid crystal display (LCD) and an organic light emitting diode (OLED), which are widely used as a display, may be manufactured in a thin plate shape, and are becoming larger in size. An increase in temperature of the display may cause malfunction, and as a result, a failure to display a screen may occur. Therefore, while the display is operating, cooling of the display is performed together.

The temperature of the display rises for various reasons such as temperature of a surrounding environment, heat generated when the display becomes brighter due to a bright surrounding environment. Especially, as the display becomes larger in size, efficient cooling of the display is more urgently required.

In view of this point, conventionally, an air circulation path configured to circulate through front and rear surfaces of the display are made, and a cooling structure configured to circulate the air and discharge heat to an outside is applied thereto. The circulating air passes heat through a heat exchanger configured to discharge heat to the outside, and accordingly heat is discharged to the outside.

The above-described circulating air passes through a front surface of the display. For this reason, when the circulating air is mixed with the outside air while in the process of cooling, unexpected particulate matters enter the front surface of the display. Therefore, the above-described circulating air is designed to circulate in an isolated state so as not to mix with the outside air. In order to prevent the circulating air from mixing with the outside air, the heat is discharged to the outside from the heat exchanger by heat conduction. In order to increase heat conductivity, a portion where the heat is conducted needs to have a large cross-sectional area.

In view of this point, most heat exchangers used for a conventional display device are installed in a rear space of the display. Since it is possible to provide a heat exchanger with a large area in the rear space of the display given that the rear space corresponds to the area of the display, it is not a bad choice to install the heat exchanger at a rear of the display only from a viewpoint of increasing heat conductivity.

However, such a conventional heat exchanger becomes complicated in its structure because it needs to be installed, avoiding locations of various substrates or related components that are present at the rear of the display. In particular, it is very difficult to design or produce a heat exchanger corresponding to a curved display.

The heat exchanger itself has a certain thickness. Thus, when the heat exchanger is arranged at the rear of the display, the display device becomes thicker, which makes it difficult to design a slim product.

SUMMARY

In order to solve the above-described technical problems, it is an object of the present disclosure to provide a cooling structure for a display device capable of simplifying a structure thereof, and making the display device slimmer by arranging a heat exchanger on a side of the display.

It is another object of the present disclosure to provide a cooling structure for a display device in which maintenance of a fan for generating an air flow is simple.

It is still another object of the present disclosure to provide a cooling structure including a heat exchanger with high heat exchange efficiency.

It is still another object of the present disclosure to provide a cooling module and a cooler in which a thickness of a display device is not increased due to a cooling structure.

It is still another object of the present disclosure to provide a cooling structure capable of more selectively cooling a portion where a lot of heat generated.

It is still another object of the present disclosure to provide a display device which may be made slimmer by applying the above-described cooling structure thereto.

The present disclosure discloses a cooling structure in which a closed air circulation path is configured to flow through a front and a rear of a display unit and pass through a side of a display; an open air flow path is arranged on the side of the display; a heat exchanger is arranged on the side of the display and is configured to perform heat exchange between air circulating through the closed air circulation path and air flowing through the open air flow path, thereby simplifying a configuration of the heat exchanger and reducing a thickness of a display device.

The present disclosure provides a cooler for the display device. The cooler may include a closed air circulation path configured to circulate through the front, rear, and side of the display unit; an open air flow path configured to flow along a longitudinal direction of the side of the display unit; and a cooling module installed at the side of the display along a longitudinal direction of the display and provided with a heat exchanger that is configured to perform heat exchange by means of the closed air circulation path and the open air flow path that are adjacent to each other.

Here, at least one longitudinal end of the cooling module may be provided with a flow fan configured to introduce outside air into the heat exchanger or discharge air that has passed through the heat exchanger to an outside, thereby allowing the outside air to flow smoothly into the cooling module and facilitating access to the flow fan.

Here, the heat exchanger may include a plurality of first passages configured to communicate with the outside air through opposite ends of the cooling module and extend along a longitudinal direction of the cooling module to form at least a part of the open air flow path, and a plurality of second passages configured to communicate at least in a front-rear direction of the cooling module and form a part of the closed air circulation path, and the plurality of first passages and second passages may be arranged alternately with each other, thereby achieving a simple heat exchanger structure and sufficiently securing an area where heat conduction is performed.

Here, a front portion of the heat exchanger may be provided with a front manifold configured to communicate with a front region of the display unit and communicate with the plurality of second passages, and a rear portion of the heat exchanger may be provided with a rear manifold configured to communicate with a rear region of the display unit and communicate with the plurality of second passages, thereby allowing the circulating air to uniformly move into the heat exchanger.

Here, the cooling module may be provided with an external communication port upstream of inlets of the plurality of first passages of the heat exchanger or downstream of outlets of the plurality of first passages of the heat exchanger, and a flow fan may be installed in the external communication port, thereby simplifying manufacturing and an assembling procedure of the display device.

Here, the plurality of first passages and second passages each may be alternately arranged in a direction away from the display unit.

Here, a circulating fan configured to induce air circulation in the closed air circulation path may be arranged in the front or rear manifold, in the heat exchanger, at the rear of the display unit. In particular, when the front and rear manifolds are configured as a cooling module and the circulation fan is installed in the cooling module, a configuration related to cooling may be modulated, thereby simplifying manufacturing and an assembly procedure of the display device.

Here, the cooler may further include a heat pipe configured to reach the cooling module from a rear surface of the display unit, and the heat pipe may traverse the first passage to be exposed to an inner space of the first passage, thereby further improving cooling efficiency.

A cooling fin may be provided to a portion of the heat pipe exposed to the inner space of the first passage, or the cooling fin may be provided to the heat pipe and at least a part of the area of the cooling fin may be exposed to the inner space of the first passage, thereby further improving cooling efficiency.

Also, the present disclosure provides a display device. The display device may include a display unit having a display surface; a housing configured to house the display unit and provided with an external communication port of an open air flow path; a front plate arranged at a front spaced from the display surface and configured to partially define a closed air circulation path; an open air flow path arranged along a longitudinal direction of the display unit at a side of the display unit, and configured to communicate with an external communication port of the housing; a closed air circulation path configured to circulate through a space between the display surface and the front plate, a side of the display unit provided with the open air flow path, and a rear space of the display unit; and a heat exchanger arranged at the side of the display unit where the open air flow path and the closed air circulation path intersect and configured to isolate air moving through the open air flow path and air moving through the closed air circulation path from each other and perform heat exchange therebetween.

The above-described cooling structure may not affect a thickness of the display device, thereby achieving a much slimmer display device.

Here, the external communication port may be provided with a flow fan configured to cause a flow of air along the open air flow path, thereby simplifying installation and maintenance of the flow fan.

Here, the heat exchanger may include a plurality of first passages configured to communicate with outside air through opposite ends of the first passages and extend along a longitudinal direction of the cooling module to form at least a part of the open air flow path; and a plurality of second passages configured to communicate at least in a front-rear direction of the cooling module and form a part of the closed air circulation path, thereby simplifying a heat exchange structure and efficiently performing heat exchange.

Here, a front portion of the heat exchanger may be provided with a front manifold configured to communicate with a space between the display surface and the front plate and communicate with the plurality of second passages, and a rear portion of the heat exchanger may be provided with a rear manifold configured to communicate with the rear space of the display unit and communicate with the plurality of second passages, thereby allowing the circulating air to uniformly flow through the plurality of second passages.

Here, a fan configured to circulate the air in the closed air circulation path may be installed in at least one location among the rear of the display unit, an interior of the heat exchanger, the front of the heat exchanger, or the rear of the heat exchanger. According to the cooling structure of the present disclosure, an installation location of the fan may be configured in various ways.

The cooler may further include a heat pipe configured to reach the heat exchanger from the rear surface of the display unit. Further, a heat conduction path of the heat pipe may be exposed to the open air flow path, thereby further enhancing cooling efficiency of the display device.

According to the present disclosure, the cooling structure of the display device may be compact and simplified, the cooling efficiency may be enhanced, and a thickness of the display device may be further reduced.

According to the present disclosure, a cooling device may be modulated, thereby simplifying assembly and maintenance of the display device.

In addition to the above described effect, a specific effect of the present disclosure will be described together with a specific matter for implementing the following disclosure.

DETAILED DESCRIPTION

Hereinafter, preferred embodiments of the present invention will be described in detail with reference to the accompanying drawings.

The present invention is not limited to the embodiments disclosed herein but may be implemented in various different forms. The description of the present embodiments are provided to understand the present invention and should not be construed as limiting the scope of the present invention.

Cooling Structure Applied to Display Device

Figure 1:
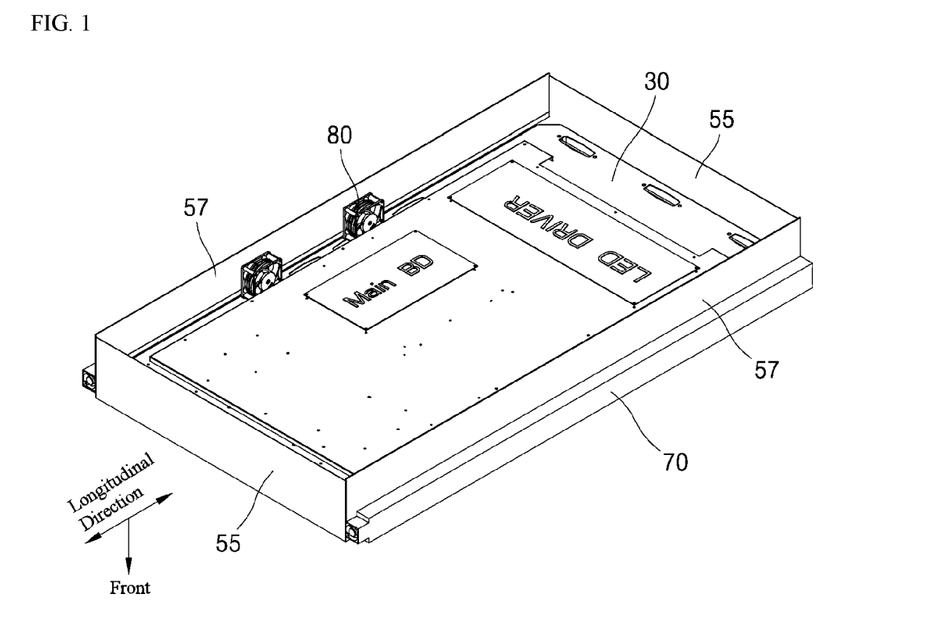
FIG. 1 is a rear perspective view of a display device to which a cooling structure is applied according to an embodiment of the present invention in a state in which a rear plate of a housing is omitted.
Figure 2:
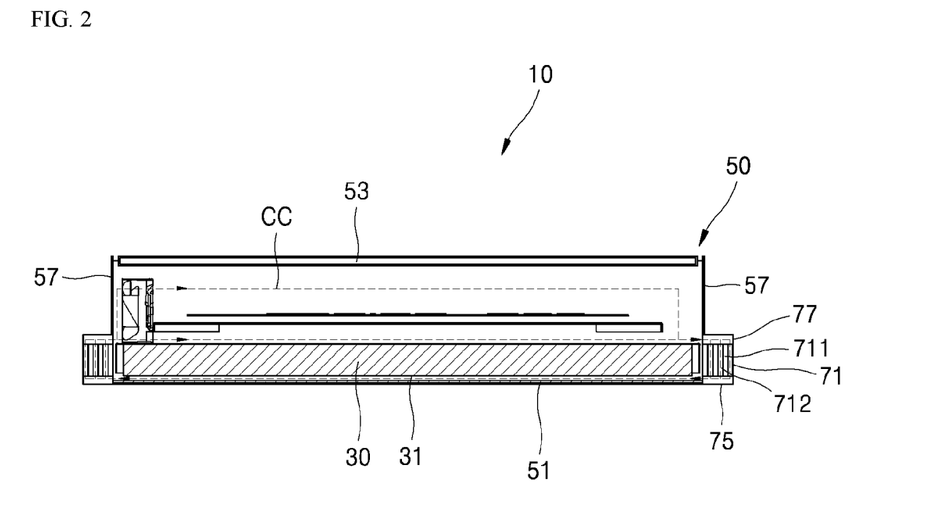
FIG. 2 is a side cross-sectional view of the display device of FIG. 1.

FIG. 1 is a rear perspective view of a display device to which a cooling structure is applied according to an embodiment of the present invention in a state in which a rear plate of a housing is omitted, and FIG. 2 is a side cross-sectional view of the display device of FIG. 1.

A display unit 30 including a display such as an LCD or an OLED may be modularized and accommodated in the housing 50. A front surface of the display unit 30 may be a display surface 31 on which a screen is displayed, and the display surface 31 may be arranged at a predetermined distance from a front plate 51 of the housing. That is, a space may be present between the front plate 51 that is made of a transparent material so that the display surface 31 is seen from an outside and the screen 31 of the display unit 30, and the space may form a part of a closed air circulation path to be described later, and air may circulate through the space.

A rear surface of the display unit 30 may be provided with a substrate including a power supply circuit, a screen control circuit and the like, and related components. The substrate and related components may be installed directly on the rear surface of the display unit 30 or may be installed on the rear surface of the display unit 30 through a bracket. A rear of display unit 30 may be provided with a rear plate 53 configured to cover the substrate and the related components, and a predetermined space may be also provided between the rear surface of the display unit 30 and the rear plate 53 of the housing. This space may also form a part of the closed air circulation path to be described later, and air may circulate therethrough.

A first side plate 55 of the housing may be provided at a short portion of four corner portions of the display device, and may be connected to the front plate and the rear plate to cover a side of the display device.

A cooling module 70 may be provided at a long portion of four corner portions that form a side surface of the display unit 30. A front end of the cooling module 70 may be connected to a front plate of the housing, and a rear end of the housing may be connected to a second side plate 57 of the housing provided at the long portion of the four corners of the display device. A rear end of the second side plate 57 of the housing may be connected to the rear plate 53.

As described above, the housing 50 of the display device 10 may house the display unit 30 and related components, which are internal components, together with the above-described cooling module 70, and may isolate the display unit 30 and the related components from outside air.

A closed air circulation path CC may be provided in a space isolated from the outside by the housing 50 and the cooling module 70. The closed air circulation path may be a path configured to circulate air through a space provided at a front of the display unit 30, a space provided at a side of the display unit and a space provided at a rear of display unit in the housing. Air circulating through the closed air circulation path may be isolated so as not to mix with the outside air.

A circulation fan 80 configured to circulate air may be installed on the rear surface of the display unit 30 to allow air to flow. For example, the circulation fan 80 may be provided at one end of the rear surface of the display unit 30, and may suck air from one long side of the display unit 30 and discharge the air to the other long side of the display unit 30. The circulating fan may be also arranged in various locations. The circulation fan configured to circulate the air along the closed air circulation path may be installed at various locations such as an interior of the cooling module to be described later, and a front, rear and interior of the heat exchanger.

The present disclosure illustrates a structure in which air circulates through a front space of the display unit, one long side space of the display unit, a rear space of the display unit, and the other long side space of the display unit. However, a structure in which air circulates through a front space of the display unit, one short side space of the display unit, a rear space of the display unit, and the other short side space of the display unit may be also applied.

Moreover, a structure in which air circulates through a front space of a display unit, one long side space and one short side space of the display unit, a rear space of the display unit, the other long side space and the other short side space of the display unit may be also applied. In particular, it is difficult or unsuitable to apply a structure in which air circulates through both a long side and a short side to a conventional heat exchanger installation structure (a structure in which a heat exchanger is arranged at a rear of a display). However, the structure in which air circulates through both a long side and a short side may be applied to a structure in which a heat exchanger is arranged at a side of a display according to the present disclosure. Further, there may be an advantage in that it may be possible to further secure a heat exchange area.

Referring to FIG. 2, when the circulating air flows through the side of the display, the circulating air may pass through the cooling module 70. The cooling module 70 may be provided with a heat exchanger 71, and thus the circulating air passing through the cooling module 70 may discharge heat to the outside through the heat exchanger 71.

The present disclosure illustrates that a heat exchanger is installed on two long opposite sides of four corners of a display unit. However, the heat exchanger may be installed only on either one side of the two long sides. In addition, the heat exchanger may have various structures such as a structure in which the heat exchanger is installed at two short opposite sides of four corners of the display unit, a structure in which the heat exchanger is installed at only one short side of four corners of the display unit, a structure in which the heat exchanger is installed on all four corners of the display unit, and the like. The heat exchanger may be installed at various locations and at a combination thereof.

The display device of the present disclosure may include an open air flow path OF (see, for example, FIG. 3) provided along a longitudinal direction of the cooling module 70 including the heat exchanger. Through the open air flow path, air outside the housing may be introduced and flow therethrough, and may be discharged back to an outside of the housing. A flow fan installed in an external communication port 73 located at a longitudinal end of the cooling module 70 may suck the air outside the housing, and the air may be pressurized to flow to the heat exchanger 71 in the cooling module 70, and the pressurized air may pass through the heat exchanger 71 in the cooling module to be discharged to the outside through an external communication port on the other side. The outside air may receive heat from the circulating air in the closed air circulation path which is at a relatively high temperature while in the process of flowing through the heat exchanger 71.

Structure of Cooling Module

The cooling module 70 of the present disclosure may basically include the heat exchanger 71. That is, the heat exchanger itself may form a cooling module. Additional components may also be added to the heat exchanger to form a cooling module.

Figure 3:
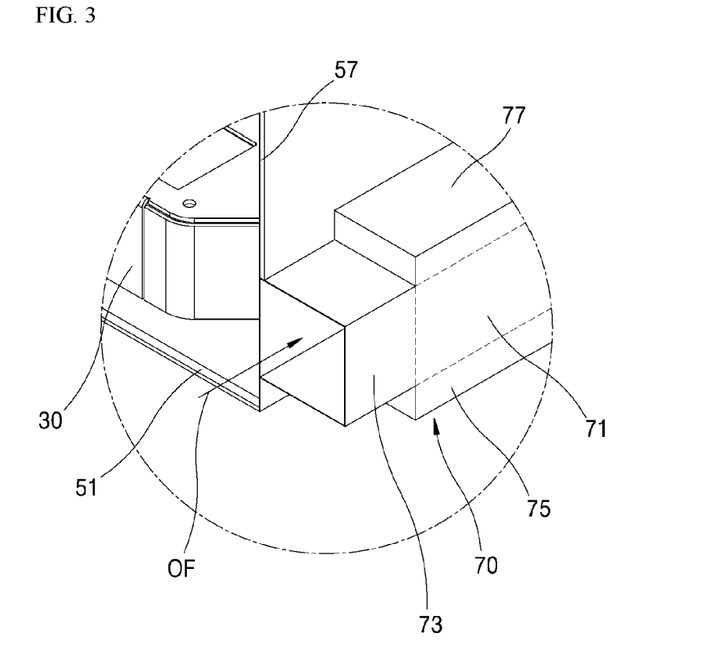
FIG. 3 is an enlarged cross-sectional view of an external communication port portion in the cooling structure of FIG. 1.
Figure 4:
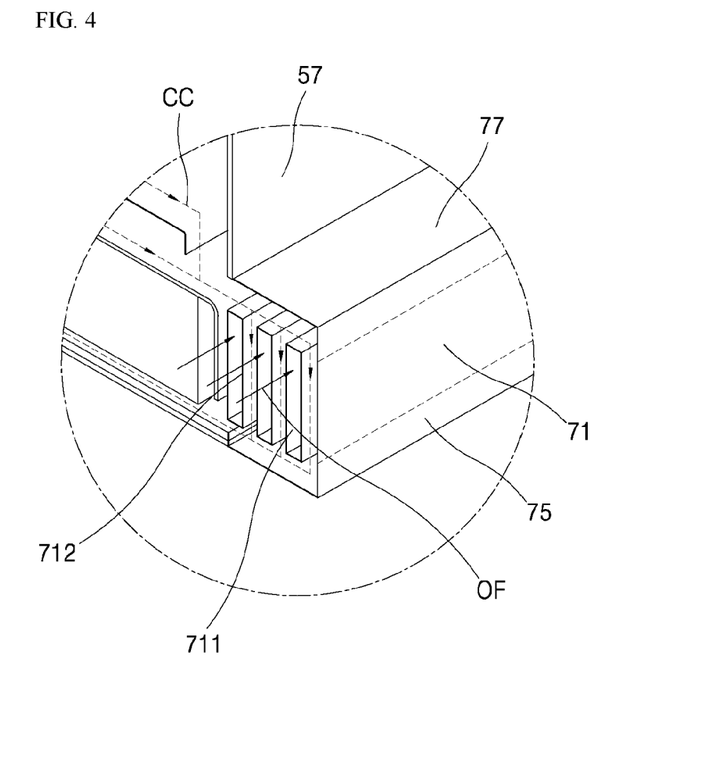
FIG. 4 is an enlarged cross-sectional view of a heat exchanger portion in the cooling structure of FIG. 1.

FIG. 3 is an enlarged cross-sectional view of an external communication port portion in the cooling structure of FIG. 1, and FIG. 4 is an enlarged cross-sectional view of a heat exchanger portion in the cooling structure of FIG. 1.

Referring to FIGS. 1 to 4, the cooling module 70 may include the heat exchanger 71 configured to perform heat exchange between air circulating through a closed path and air flowing through an open path, and the heat exchanger 71 may be provided with a plurality of first passages 711 through which the air flowing through the open path passes and a plurality of second passages 712 through which the air circulating through the closed path passes.

The first passages 711 may extend in parallel along a longitudinal direction of the heat exchanger, and longitudinal opposite ends thereof may be opened to communicate with the outside air. The second passages 712 may be provided between the first passages 711, and may be opened only in a front-rear direction so that air circulating in the housing flows through the second passages 712. The second passages 712 may be opened only in a front-rear direction to communicate with the closed air circulation path, and may be closed with respect to the first passages 711 and the external communication port 73. Thus, air flowing through the first passages 711 and air flowing through the second passages 712 may not mix with each other, but may merely exchange heat through a wall between the passages. These first passages 711 and second passages 712 may be alternately arranged along a direction away from the display unit. In addition, the first passages 711 and the second passages 712 may be made in a more divided form than a form illustrated in the figures in consideration of an air flow resistance and a heat exchange area.

The external communication port 73 may be provided at a longitudinal end of the cooling module 70. A flow fan may be provided in the external communication port 73 to introduce air outside the housing into the open air flow path. That is, the external communication port 73 may be arranged between an outer space of the housing and the first passages of the heat exchanger so that these spaces communicate with each other, and may have a structure in which the flow fan may be installed. Outside air, which is air outside the housing, may be pressurized by the fan, and may flow in an order of one side of the external communication port, the first passages 711 of the heat exchanger 71, and the outer space of the housing.

The external communication port 73 may be provided at each of longitudinal opposite ends of the cooling module 70. Further, the flow fan may be installed in both of the external communication ports provided at opposite sides. In addition, the external communication port 73 may not be provided, and the flow fan may be arranged at the front or/and the rear of the heat exchanger so as to introduce air into the first passages of the heat exchanger or/and to suck air from the first passages and discharge the air.

In the cooling module 70, a front manifold 75 and a rear manifold 77 may be provided at the front and rear of the heat exchanger 71, respectively. The front manifold 75 may allow a space between the display surface 31 and the front plate 51 to communicate with front ends of the second passages 712, and the rear manifold 77 may allow a rear space of the display unit 30 of the housing 50 to communicate with rear ends of the second passages 712. These manifolds may define a closed space without communicating with a space other than an inner space of the housing and the second passages.

The manifolds may allow the air circulating in the housing to be uniformly distributed to the plurality of second passages 712 of the heat exchanger, which are an air flow path portion in which the air is divided into a plurality of portions. A front surface of the front manifold may be placed on the same flat surface as the front plate of the housing.

On the other hand, the rear surface of the rear manifold may not need to be located on the same flat surface as the rear plate 53 of the housing, but may be located further downward than the rear plate 53 illustrated in FIG. 2. As shown in the drawings, a space provided by a difference in location between the rear plate 53 and the rear surface of the rear manifold 77 may be utilized as a space for installing a speaker device or a woofer that is installed on a bottom surface of the display device.

In the cooling module, a rear portion (upward direction in FIG. 2) may have an available space in comparison to a front portion (downward direction in FIG. 2), and thus it is possible to further widen the heat exchange area of the heat exchanger by further increasing a volume of the heat exchanger to the rear, or it is possible to arrange the circulation fan configured to pressurize the air circulating through the closed path in the rear manifold after further increasing the volume of the rear manifold to the rear. In any case, it can be seen that the cooling module 70 including the manifolds does not affect the thickness of the display device.

When the heat exchanger, the external communication port, the manifold, the fan and the like are all modularized into the cooling module, components related to the cooler may be integrated into the module. As a result, manufacturing and an assembling process of the display device may become much simpler.

Heat Pipe Cooling Structure

In the present disclosure, it is possible to apply a heat pipe cooling structure in addition to the above-described cooling structure through air circulation. When a heat pipe is applied, it is possible to directly transfer heat generated from the rear surface of the display unit 30, which generates a lot of heat, to the above-described heat exchanger through the heat pipe. In the case where the heat exchanger is located in a portion of the rear of the display as in a conventional structure, not only applying the heat pipe may be complicated, but also heat generated from the rear of the display may remain constantly at the rear of the display while being transferred through the heat pipe, and thus it would be undesirable in terms of heat release. On the other hand, the structure according to the present disclosure is more meaningful in terms of an application of the heat pipe in that heat generated from a heat source may be rapidly conducted up to a location away from the rear of the display unit through the heat pipe.

Figure 5:
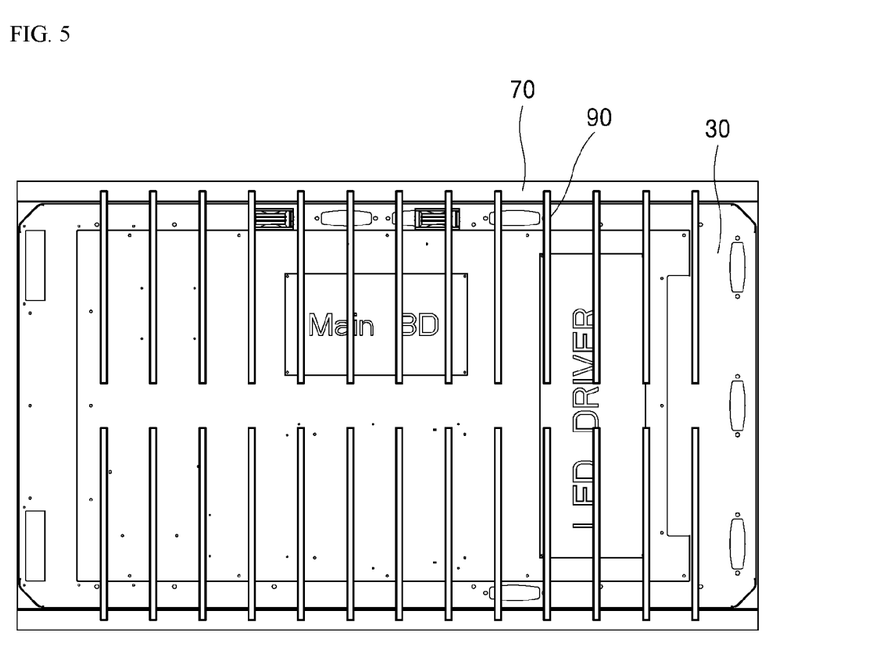
FIG. 5 is a rear view of a display device to which a heat pipe is applied according to an additional embodiment of the present invention in a state in which a rear plate of a housing is omitted.
Figure 6:
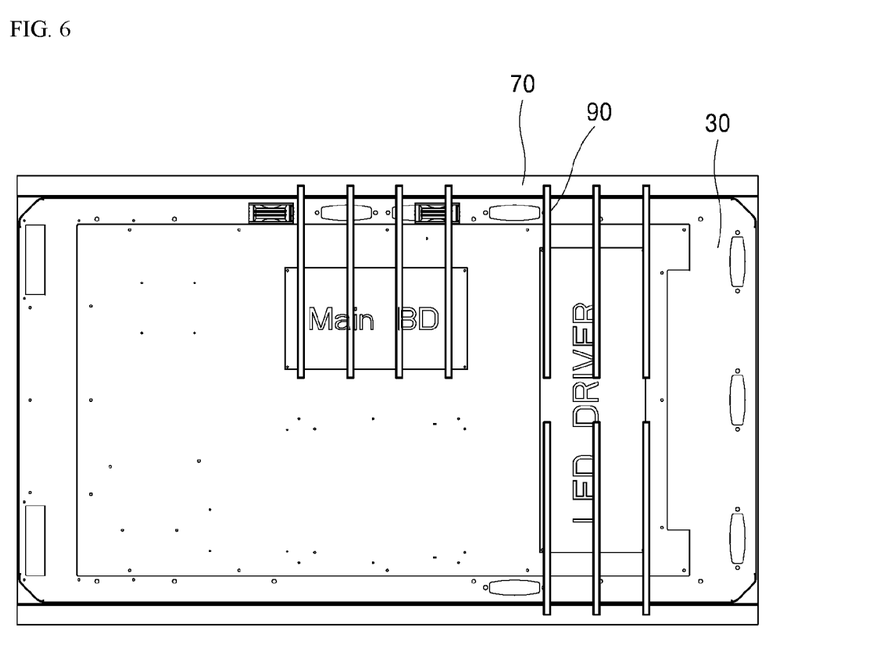
FIG. 6 is a rear view of a display device to which a heat pipe is applied according to another additional embodiment of the present invention in a state in which a rear plate of a housing is omitted.
Figure 7:
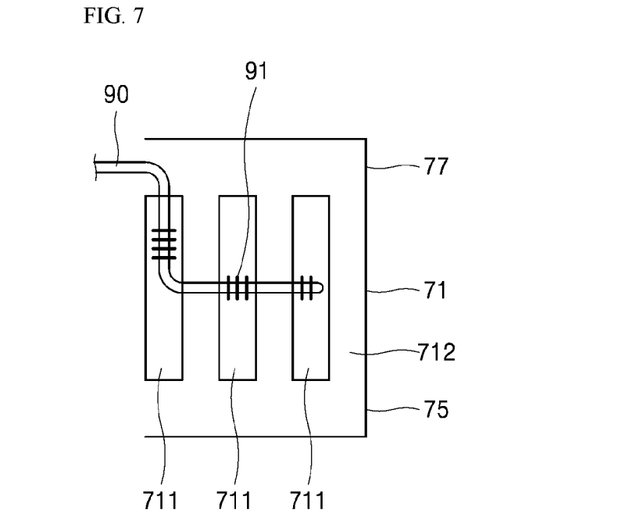
FIGS. 7 and 8 are cross-sectional views illustrating forms in which the heat pipes of FIGS. 5 and 6 are installed in a cooling module.
Figure 8:
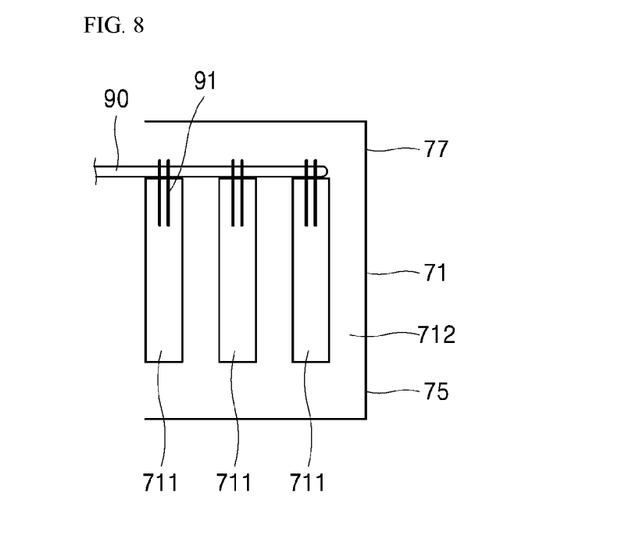

FIG. 5 is a rear view of a display device to which a heat pipe is applied according to an additional embodiment of the present invention in a state in which a rear plate of a housing is omitted, FIG. 6 is a rear view of a display device to which a heat pipe is applied according to another additional embodiment of the present invention in a state in which a rear plate of a housing is omitted, and FIGS. 7 and 8 are cross-sectional views illustrating forms in which the heat pipes of FIGS. 5 and 6 are installed in a cooling module.

A heat pipe 90 may be a device configured to rapidly transfer heat from one side to the other side through evaporation of a fluid inside the heat pipe. This pipe may be a pipe that is depressurized by exhausting an interior thereof, and the interior of the pipe having a lot of small holes that may be filled with volatile liquid. When heat is applied to one end of this pipe, the volatile liquid may evaporate and move to the other end with heat energy. The vaporized gas may be dissipated and liquefied at the other end of the pipe, and the liquid may be returned to its original location by capillary action. This pipe may have a heat transfer rate about 50 times faster than copper or aluminum with high heat conductivity. Copper, stainless steel, ceramic, tungsten and the like may be used as a material of a main body, and porous fiber may be used as an interior wall. Methanol, acetone, water, mercury, and the like may be used as internal volatile substances.

Referring to FIGS. 5 and 6, in an arrangement structure of the heat pipe 90 applied to the cooling structure of the display device according to the present disclosure, the heat pipe 90 may be arranged in a direction extending from the rear surface of the display unit 30 toward the cooling module 70, and a longitudinal direction of the heat pipe may be oriented to be perpendicular to a longitudinal direction of the cooling module in order to minimize a heat transfer path.

The display device illustrated in FIGS. 5 and 6 may be provided with a cooling module on each of long opposite sides. Accordingly, the heat pipe 90 may be installed in a direction extending from the vicinity of the center of the display unit toward the cooling module provided on each of the opposite sides on the basis of a breadthwise centerline of the display unit 30.

As illustrated in FIG. 5, it is possible to arrange a plurality of heat pipes 90 side by side at equal intervals over the entire area of the display unit. An interval between the heat pipes may be determined in consideration of cooling capabilities of the closed type air circulation path and the open air flow path used when performing heat exchange in the heat exchanger, a portion where heat is generated, an amount of heat generated, and the like.

The cooling capabilities used when the closed type air circulation path and the open air flow path perform heat exchange in the heat exchanger may be sufficient to cool the entire display device. But, in the case where heat is generated severely only in a partial area, the heat pipe 90 may be partially installed so as to cover an area where heat generation is concentrated as illustrated in FIG. 6. The heat pipe 90 may be in direct or indirect contact with a portion where heat is generated to absorb the generated heat, and may rapidly transfer the heat to the cooling module 70.

The heat of the heat pipe 90 transferred to the vicinity of the cooling module 70 may need to be rapidly dissipated, and it is desirable that the heat is radiated to air, which is a fluid passing through the first passages 711. In order to implement such a heat transfer path, the present disclosure may allow for the heat pipe 90 to pass through the first passages 711 as illustrated in FIG. 7. Of course, a space between first passages 711 and the second passages 712 may remain in a sealed state even when the heart pipe 90 passes through wall portions of the first passages. Further, a fin 91 may be provided to enhance heat transfer efficiency between the heat pipe and the fluid flowing through the first passages 711. The fin 91 may be arranged in spaces of the first passages 711, thereby greatly widening a cross-sectional area for heat transfer.

As illustrated in FIG. 8, heat exchange may be smoothly performed in a manner that only the heat radiating fin 91 passes through outer walls of the first passages 711 to be exposed to the inner spaces of the first passages 711.

In order to implement a structure in which the heat pipe is partially embedded in the cooling module 70 as described above, a manufacturing method such as insert injection or the like may be applied.

The above-described heat pipe structure may particularly exhibit an effective cooling effect in a region where heat generation is concentrated as illustrated in FIG. 6, and may also perform cooling with respect to the entire region as illustrated in FIG. 5. In particular, the cooling structure by the heat pipe as illustrated in FIG. 5 may be designed so as to omit the closed air circulation path in some cases.

Embodiments of the present invention is described with reference to illustrative drawings, but is not limited by the embodiments described herein and accompanying drawings. It should be apparent to those skilled in the art that various changes which are not exemplified herein but are still within the spirit and scope of the present invention may be made. Further, it should be apparent that, although an effect from a configuration of the present disclosure is not clearly described in the embodiments of the present invention, any effect, which can be predicted from the corresponding configuration, is also to be acknowledged.

What is claimed is:

1. A display device, comprising:
a display unit having a front surface which is a display surface, a rear surface which is opposed to the front surface, and a side surface which is disposed between an edge of the front surface and an edge of the rear surface;
a housing to house the display unit, the housing provided with an external communication port of an open air flow path;
a front plate of the housing arranged at a front spaced from the display surface, the front plate partially defining a closed air circulation path;
a rear plate of the housing arranged at a rear of the rear surface and spaced apart from the rear surface;
a side plate of the housing connected to the front plate and the rear plate to cover the side surface of the display unit;
a cooling module defining the open air flow path arranged along a longitudinal direction of the side surface of display unit at the side surface of the display unit, the longitudinal direction is perpendicular to front-rear direction, and the open air flow path configured to communicate with the external communication port of the housing;
the closed air circulation path to circulate air through a space between the display surface and the front plate, the cooling module at the side surface of the display unit provided with the open air flow path, and a rear space of the display unit which is defined by the rear surface and the rear plate; and
the cooling module including a heat exchanger arranged at the side surface of the display unit where the open air flow path and the closed air circulation path intersect, the heat exchanger to isolate air moving through the open air flow path and air moving through the closed air circulation path from each other and perform heat exchange therebetween,
wherein the heat exchanger is not disposed in the rear space of the display unit.

2. The display device of claim 1,
further comprises a flow fan to cause a flow of air along the open air flow path and is installed in the external communication port.

3. The display device of claim 1,
wherein the heat exchanger includes:
a plurality of first passages to communicate with outside air through opposite ends thereof and extend along a longitudinal direction of the cooling module to form at least a part of the open air flow path; and
a plurality of second passages to communicate at least in a front-rear direction of the cooling module and form a part of the closed air circulation path.

4. The display device of claim 3,
wherein the plurality of first passages and second passages are alternately arranged along a direction away from the display unit.

5. The display device of claim 3,
wherein a front portion of the heat exchanger is provided with a front manifold to communicate with a space between the display surface and the front plate and communicate with the plurality of second passages, and
wherein a rear portion of the heat exchanger is provided with a rear manifold to communicate with a rear space of the display unit and communicate with the plurality of second passages.

6. The display device of claim 1,
further comprises a fan to circulate air in the closed air circulation path and is installed in at least one location among a rear of the display unit, an interior of the heat exchanger, a front of the heat exchanger, and a rear of the heat exchanger.

7. The display device of claim 1, further comprises a heat pipe to reach the heat exchanger from a rear surface of the display unit.

8. The display device of claim 7,
wherein a heat conduction path of the heat pipe is exposed to the open air flow path.

9. The display device of claim 5, further comprises
a circulation fan to induce air circulation in the closed air circulation path arranged in the rear manifold.

10. The display device of claim 7, wherein the heat pipe is provided with a cooling fin.

11. The display device of claim 7, wherein the heat pipe traverses the open air flow path to be exposed to an inner space of the open air flow path.

12. The display device of claim 1, wherein at least one longitudinal end of the cooling module is provided with a flow fan to introduce outside air to the heat exchanger or discharge air that has passed through the heat exchanger to an outside.

\* \* \* \* \*